(12) United States Patent
Ren et al.

(10) Patent No.: US 10,707,397 B2
(45) Date of Patent: Jul. 7, 2020

(54) SYSTEMS, METHODS, AND MATERIALS FOR CRYOGENIC THERMOELECTRIC COOLING

(71) Applicant: University of Houston System, Houston, TX (US)

(72) Inventors: Zhifeng Ren, Houston, TX (US); Machhindra Koirala, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 226 days.

(21) Appl. No.: 14/657,247

(22) Filed: Mar. 13, 2015

(65) Prior Publication Data
US 2016/0260881 A1 Sep. 8, 2016

Related U.S. Application Data

(60) Provisional application No. 61/954,726, filed on Mar. 18, 2014.

(51) Int. Cl.
| | |
|---|---|
| *H01L 35/20* | (2006.01) |
| *C22C 1/04* | (2006.01) |
| *C22C 28/00* | (2006.01) |
| *H01L 35/34* | (2006.01) |
| *H01L 35/14* | (2006.01) |

(Continued)

(52) U.S. Cl.
CPC .......... *H01L 35/20* (2013.01); *B22F 1/0085* (2013.01); *B22F 3/02* (2013.01); *C22C 1/0425* (2013.01); *C22C 1/0491* (2013.01); *C22C 9/00* (2013.01); *C22C 28/00* (2013.01); *C22C 30/02* (2013.01); *H01L 35/14* (2013.01); *H01L 35/34* (2013.01); *B22F 2998/10* (2013.01)

(58) Field of Classification Search
CPC .......... B22F 2998/10; B22F 3/14; B22F 3/24; B22F 9/04; B22F 1/0085; B22F 3/02; C22C 1/0425; C22C 1/0491; C22C 28/00; C22C 30/02; C22C 9/00
See application file for complete search history.

(56) References Cited

U.S. PATENT DOCUMENTS

| | | | | |
|---|---|---|---|---|
| 5,259,442 A | * | 11/1993 | Clark ..................... | B22D 27/20 164/461 |
| 2002/0153071 A1 | * | 10/2002 | Segal .................... | B21C 23/001 148/684 |

(Continued)

FOREIGN PATENT DOCUMENTS

| | | |
|---|---|---|
| JP | 2006037149 A | 2/2006 |
| KR | 100689253 B1 | 2/2007 |

OTHER PUBLICATIONS

Mitsuda, A. et al. "Thermoelectric power of heavy-fermion system YbCu5-xAgx" 2006. Physica B. 378-380. p. 742-743.*

(Continued)

*Primary Examiner* — Colleen P Dunn
*Assistant Examiner* — Nicholas A Wang
(74) *Attorney, Agent, or Firm* — Conley Rose, P.C.

(57) ABSTRACT

Materials and systems and methods of manufacture thereof that function as thermoelectric materials both in and near a cryogenic temperature range. In particular, the synthesis of heavy fermion materials that exhibit higher ZTs than previously achieved at cryogenic and near-cryogenic temperatures.

18 Claims, 13 Drawing Sheets

(51) Int. Cl.
  *C22C 9/00* (2006.01)
  *B22F 1/00* (2006.01)
  *B22F 3/02* (2006.01)
  *C22C 30/02* (2006.01)

(56) References Cited

U.S. PATENT DOCUMENTS

2008/0202575 A1* 8/2008 Ren .................... H01L 35/16
                                                      136/201
2010/0139730 A1  6/2010 Bentien et al.
2011/0248209 A1* 10/2011 Androulakis ......... C01B 19/002
                                                      252/71

OTHER PUBLICATIONS

Golubkov, A.V. "Thermal conductivity of the light heavy-fermion compound YbIn0.7Ag0.3Cu4" 2001. Physics of the solid state. 43. (10) p. 1811-1815.*

Koirala, M. et al. "nanostructured YbAgCu4 for potentially cryogenic thermoelectric cooling." 2014. Nano Letters. 14. p. 5016-5020. (Year: 2014).*

Misiorek et al. "Transport properties of heavy fermion compounds: YbIn1-xCu4+x and YbIn1-yAgyCu4." 2003. International journal of thermophysics. vol. 24. 5. p. 1415-1426 (Year: 2003).*

Modern Alloy Production, Reference Information Library, added to ASM Handbooks Online: ASM Desk Editions and General References, ASM International, 2013. (Year: 2013).*

Academic Press Dictionary of Science and Technology. "Sintering." 1992. (Year: 1992).*

Vacuum Arc Remelting, Casting, vol. 15, ASM Handbook, ASM International, 2008, p. 132-138 (Year: 2008).*

Indinger, A. et al. "Transport and thermodynamic properties of YbCu4AuxAg1-x." 1995. Physics B. 206-207. p. 349-351 (Year: 1995).*

Shaburov, V.A. et al. "Electronic structure of Yb, Ag, and Cu in the heavy-fermion system YbCu5-xAgx." 2001. Physics of the solid state. 43. p. 1363-1368. (Year: 2001).*

Golubkov, A.V., et al., "Heat Conductivity of the Heavy-Fermion Compound YbAgCu4," Physics of the Solid State, vol. 43, No. 2, 2001, pp. 218-223 (6 p.).

PCT/US2015/020404 International Search Report and Written Opinion dated Jun. 18, 2015 (14 p.).

Golubkov, A.V., et al., "Thermal Conductivity of the 'Light' Heavy-Fermion Compound YbIn0.7Ag0.3Cu4," Physics of the Solid State, vol. 43, No. 10, 2001, pp. 1811-1815 (5 p.).

He, J., et al., "A Cubic AuBe5-Type YbCu5 Phase with Trivalent Yb Ion," Journal of Alloys and Compounds 240 (1996) 261-265 (5 p.).

* cited by examiner

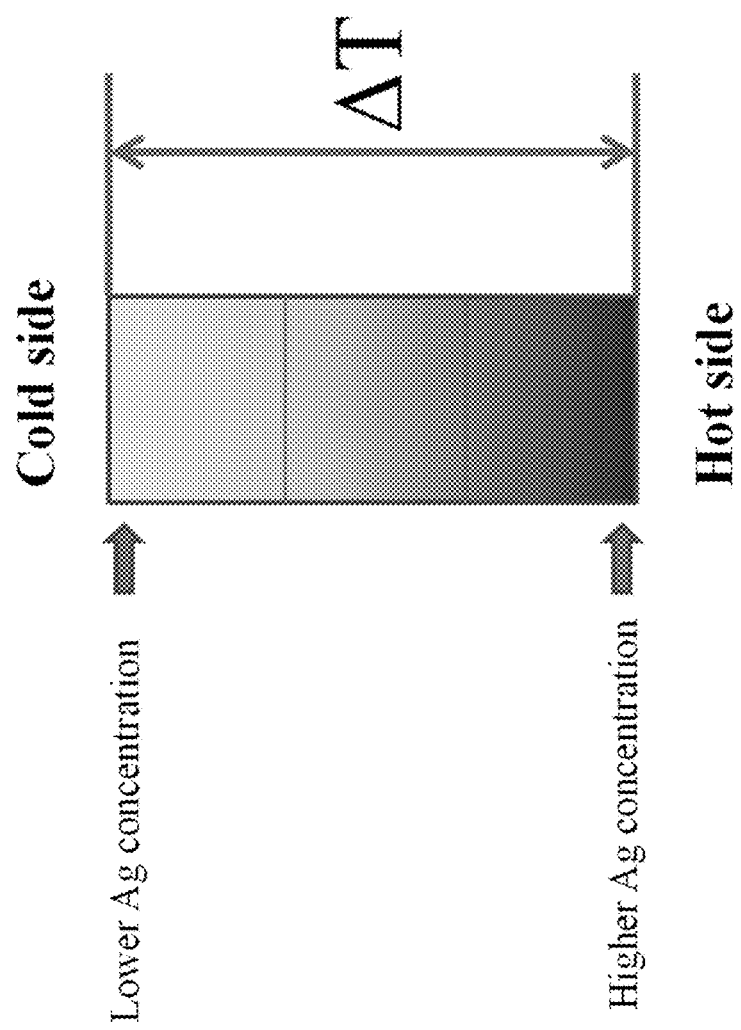

SYSTEMS, METHODS, AND MATERIALS FOR CRYOGENIC THERMOELECTRIC COOLING

CROSS-REFERENCE TO RELATED APPLICATIONS

This application claims priority to and incorporates in its entirety U.S. Provisional Patent Application No. 61/954,726, "Systems, Methods, and Materials for Cryogenic Thermoelectric Cooling," filed Mar. 18, 2014.

RESEARCH OR DEVELOPMENT

The work disclosed in this provisional application was done for the Multi-University Research Initiative (MURI) Program under grant number FA9550-10-10533.

BACKGROUND

Background of the Technology

Over the past decades, thermoelectric materials have been extensively studied for potentially broad applications in refrigeration, waste heat recovery, solid state solar thermal energy conversion, etc. The efficiency of thermoelectric devices is governed by the material's dimensionless figure of merit $ZT=(S^2\sigma/\kappa)T$, where S, $\sigma$, T, and $\kappa$ are the Seebeck coefficient, electrical conductivity, absolute temperature, and thermal conductivity, respectively.

BRIEF SUMMARY OF THE DISCLOSURE

In an embodiment, a method of manufacturing a thermoelectric material, comprising: hot-pressing a powder to form a thermoelectric material comprising a ZT of greater than 0.10 at below about 45 K, wherein, prior to hot-pressing, forming the powder from an ingot comprising ytterbium (Yb), copper (Cu), and silver (Ag). The embodiment further comprising wherein forming the powder comprises ball-milling the ingot, wherein the ingot is fabricated according to the formula $YbAg_xCu_{5-x}$ or $YbAgC_xD_y$, where in C comprises Cu, where in D comprises one of gold (Au), zinc (Zn), cadmium (Cd), mercury (Hg), aluminum (Al), gallium (Ga), indium (In), and tellurium (Te), and wherein the ratio of the Cu to the Ag is about (4+x):(1−x) to (4−x):(1+x).

In an embodiment, a thermoelectric material comprising: a thermoelectric material according to the formula $YbAgC_xD_y$, wherein the thermoelectric material comprises a ZT of greater than 0.10 at below about 45 K, wherein X is greater than 1, wherein C comprises copper (Cu), and wherein D comprises one of gold (Au), zinc (Zn), cadmium (Cd), mercury (Hg), aluminum (Al), gallium (Ga), indium (In), and tellurium (Te).

A thermoelectric material comprising: a thermoelectric material comprising the formula $YbAg_xCu_{5-x}$, wherein the thermoelectric material comprises ZT of greater than 0.10 at below about 45 K, and wherein x is from about 0.5 to about 1.5.

Exemplary embodiments described herein comprise a combination of features and characteristics intended to address various shortcomings associated with certain prior devices, compositions, systems, and methods. The various features and characteristics described above, as well as others, will be readily apparent to those of ordinary skill in the art upon reading the following detailed description, and by referring to the accompanying drawings.

BRIEF DESCRIPTION OF THE DRAWINGS

For a detailed description of the exemplary embodiments disclosed herein, reference will now be made to the accompanying drawings in which:

FIG. 7 is an illustration of a temperature gradient along a thermoelectric device that may be fabricated with materials fabricated according to embodiments of the present disclosure.

DETAILED DESCRIPTION OF EXEMPLARY EMBODIMENTS

Figure 1A:
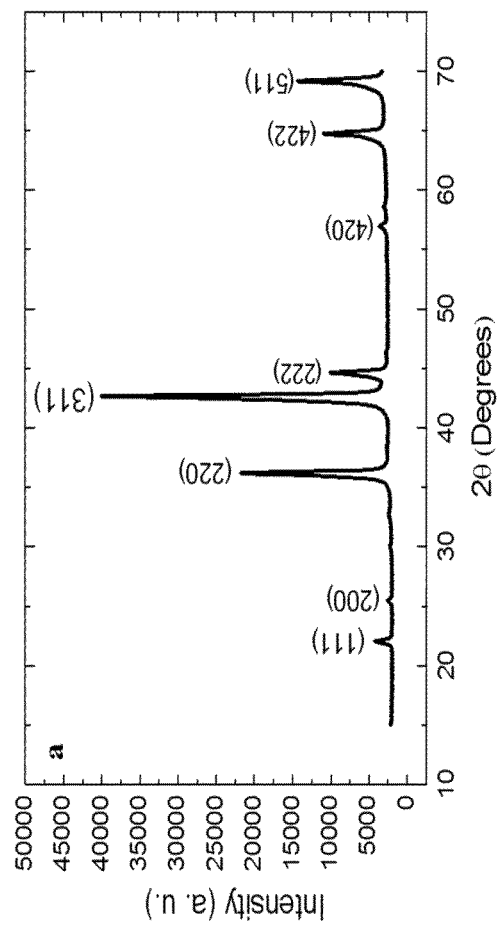
FIG. 1A is an x-ray diffraction (XRD) pattern of a $YbAgCu_4$ sample fabricated according to certain embodiments of the present disclosure.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

The development of new techniques for controlling the material properties through nanostructuring, modulation doping, resonant doping, and band engineering near the Fermi level have helped to enhance the thermoelectric figure-of-merit (ZT) significantly in various materials. It is appreciated that nanostructured materials may be considered to be those materials that comprise grains that are sized in at least one dimension between 1 nm-1000 nm and, in some embodiments, may be those with a grain size between 1 nm-100 nm, and that a nanostructuring process produces materials with grains in those size ranges. While nanostructured materials are discussed herein, it is appreciated that, in some embodiments for various compositions and end applications, heavy fermion materials that are not nanostructured or that are partially nanostructured may also be manufactured. An enhanced ZT (at or above 1.0) indicates the viability of these materials for thermoelectric applications including cooling applications. In some embodiments, ZT values lower than 1.0 may be utilized, depending upon the application. However, at low temperatures, including those in the cryogenic range, the existing ZT is far below the application requirement of the end application where the material is to be employed. In an embodiment, the cryogenic temperature range may be defined as those temperatures below −150° C., or about 120 K.

As discussed herein, embodiments of Yb- and Ce-based rare earth Kondo systems may be employed as thermoelectric materials for low temperature applications due to their large Seebeck coefficient and power factor. A Kondo system refers to an alloy system that exhibits the Kondo effect, which is a change in electrical resistivity with temperature due to the scattering of the conduction electrons in the alloy due to impurities, specifically magnetic impurities. The Kondo effect may explain the formation of heavy fermions, also discussed herein, in intermetallic compounds such as Yb or any rare-earth element or rare-earth-based compounds. The Kondo temperature is discussed herein and is the temperature ($T_K$) at which the Kondo effect predominates for a specified host material (composition) and magnetic impurity.

However, the ZT of heavy fermion materials has previously only been achieved far at such low values as to render the related compounds useless for these cryogenic applications. In some applications, a ZT below 1 may be desirable for cryogenic applications because cryogenic applications exist at such a low temperature range. Conventional heavy Fermion systems do not exhibit a usable ZT at cryogenic temperatures, much less a ZT of about 0.11 at low (cryogenic) temperature ranges as discussed in an embodiment herein.

The nanostructured $YbAgCu_4$ material fabricated according to certain embodiments of the present disclosure raises the ZT of the $YbAgCu_4$ material to a ZT suitable for thermoelectric applications, for example, those occurring at temperatures that fall within the cryogenic region (temperature range). In an embodiment, nanostructured $YbAgCu_4$ was prepared by arc melting to form a homogeneous ingot followed by a ball milling process. The stoichiometric ratio of 99.9% pure silver (Ag) and 99.9% copper (Cu), which may both be in the form of granules, powder, or other suitable form for melting, was kept in an arc melting hearth and melted to make a single piece. In some embodiments, multiple pieces (instead of a single piece or ingot) may be formed using similar methods to create a homogeneous Ag—Cu alloy. In some embodiments, subsequently, 99.9% pure Yb pieces were kept in an arc melting hearth with Ag—Cu piece or pieces and melted together. To compensate for the volatile loss of Yb, a certain percentage of extra Yb, which may be from 1% to 25% Yb, depending on the system set up and operation, may be used during arc melting process. In one embodiment of the arc melting approach, direct contact between the arc and the Yb is avoided, as the Yb may be volatile in nature.

In an alternate embodiment, the melting method may be another type of melting process other than arc melting that may be repeated for a number of cycles to produce a homogeneous ingot. While $YbAgCu_4$ is discussed herein, this process may also be used for other heavy Fermion materials including not only Yb-based compounds but also other compounds based on rare-earth elements (rare-earth element compounds). In this embodiment, the melting process was repeated 8 times (8 cycles) by monitoring the total weight loss after each melt cycle. The ingot formed by this process was polished with a metal brush and ball milled for 6 hours in a high energy ball milling machine. Samples of the powder were DC hot pressed at 550° C., 650° C., and 750° C., respectively at a pressure of about 100 MPa for five minutes. It is appreciated that, while in this embodiment a pressure of 100 MPa and the temperatures of 550° C., 650° C., and 750° C. were employed for hot-pressing, other pressures and temperatures may be used that may be higher or lower than those discussed in this embodiment. The temperature and pressure employed in the fabrication process may depend in part upon, for example, the material composition and/or the end application, e.g., the ZT or other thermoelectric property and properties desired for the end application.

The samples of $YbAgCu_4$ fabricated according to embodiments of the present disclosure were characterized by X-ray diffraction (Panalytical X'pert), high resolution transmission electron microscope (HRTEM, JEOL 2100F), scanning electron microscope (SEM, LEO 1525) to characterize the phase formation, crystallinity, homogeneity, grain size distribution and grain boundary. Samples measuring 3×3×5 $cm^3$ were tested for temperature dependent electrical conductivity, Seebeck coefficient, and thermal conductivity using a physical properties measurement system (PPMS) with a thermal transport option (TTO).

In the experiments disclosed herein, a power factor of about 131 $\mu W\ cm^{-1}\ K^{-2}$ has been obtained at 22 K which is much higher than the power factor of other well-known thermoelectric materials. The implementation of the nanostructuring method decreased the thermal conductivity at 42 K by 50% compared to previously reported value by boundary scattering. The nanostructuring method refers to the part of the process where the alloy is melted and ball-milled and, in some embodiments, may also refer to the hot-pressing of the ball-milled alloy. A peak ZT of 0.11 has been achieved at 42 K. Such a ZT is roughly one order of magnitude higher than nanostructured $FeSb_2$ and about 4 times (~4×) higher than the highest reported ZT of the best $FeSb_2$ that has been extensively studied for its potential cryogenic applications. The nanostructuring approach discussed herein used to synthesize this thermoelectric material can be extended to other heavy Fermion materials to maintain a very high power factor and to decrease the thermal conductivity. A heavy Fermion system may be an intermetallic compound comprising elements with electrons in the 4f or 5f electron orbitals. The term "heavy Fermion" may reflect the fact that the partially filled f-orbitals may behave like localized magnetic moments. That is, the Fermion material may behave as it has an effective mass (the mass that the material has when responding to forces) greater than its rest mass. The products, systems, and methods disclosed herein are directed towards the synthesis of other Fermion materials that exhibit previously unseen thermoelectric properties in a cryogenic temperature range.

YbAgCu$_4$ comes from the family of parent compound YbCu$_5$ that is nonmagnetic metallic with hexagonal structure. The replacing of one Cu atom by Ag makes a dramatic change in crystal structure and turns it into face centered cubic (fcc) structure. YbAgCu$_4$ has been classified as moderate heavy Fermion with a Summerfield coefficient γ of about 250 mJ mol$^{-1}$ K$^{-2}$, γ=C/T where C is the electronic specific heat. The spin exchange interaction between f orbital and conduction electron is much stronger than the intersite Ruderman-Kittel-Kasuya-Yosida (RKKY) interaction and any other possible crystalline field splitting effect. The Yb ion in YbAgCu$_4$ experiences the cubic crystalline field splitting effect which may have a very small effect on the electrical and thermal properties of the materials. The effect of crystalline field splitting is masked by Kondo effect. The negligible crystalline field splitting ensures that the Seebeck coefficient does not cross from negative to positive on measured temperature range (about 5 K to about 300 K). The ground state of YbAgCu$_4$ is intermediate valence compound with 8 fold degeneracy. There is the presence of a giant Seebeck peak at 45 K that may be due to the Kondo scattering of conduction electron from almost the full f band. When the temperature is further lowered, there is sharp drop in electrical resistivity due to Kondo lattice formation. The electron-phonon interaction and electron-electron scattering contribute to electrical resistivity and hence there is a sharp drop in the electrical resistivity at lower temperature.

Figure 1B:
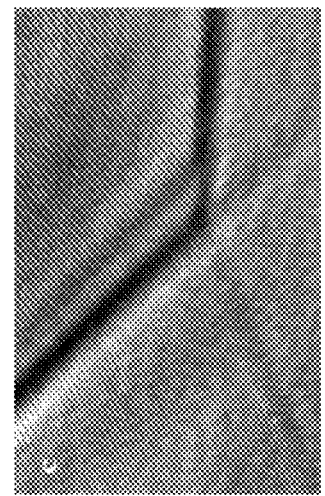
FIGS. 1B and 1C are SEM images of a $YbAgCu_4$ sample fabricated according to certain embodiments of the present disclosure.
Figure 1C:

Referring now to FIG. 1A, the YbAgCu$_4$ sample, created by ball-milling and then hot pressing the ball-milled powder at 750° C. for 5 min. The sample is a single phase as indicated by the XRD spectrum in FIG. 1A, and can be indexed by AuBe$_5$-type face centered cubic (fcc) structure. The TEM images shown in FIGS. 1B and 1C indicate that the grains are closely packed and the crystallinity (the degree of structural order) of the grains is good and the grain boundaries are clean. The samples of YbAgCu$_4$ were hot pressed at different temperatures and analyzed using SEM as illustrated in FIGS. 1D-1F to study the effect of hot pressing temperature on the grain size and distribution.

Figures 1D, 1E, 1F:
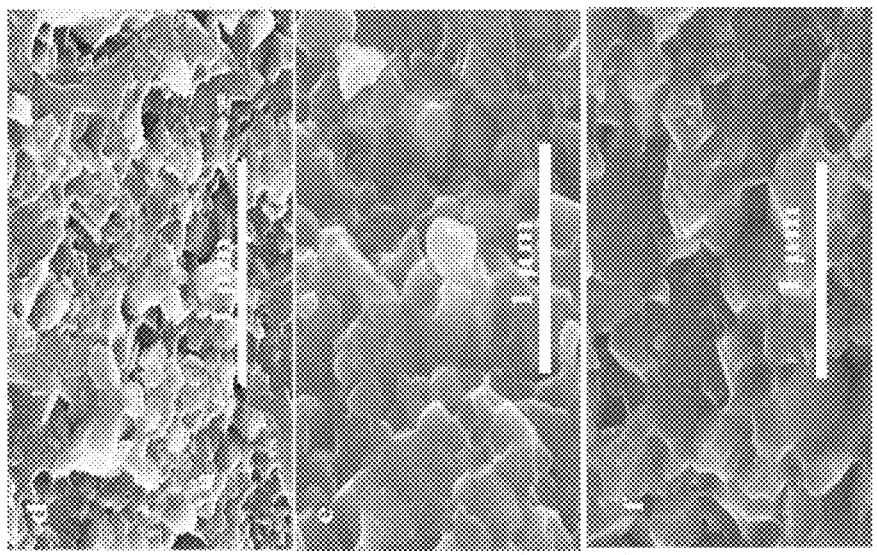
FIGS. 1D-1F are TEM images of $YbAgCu_4$ samples hot pressed at various temperatures according to certain embodiments of the present disclosure.

Referring now to FIG. 1D (the SEM image of the YbAgCu$_4$ sample hot pressed at 550° C.), FIG. 1E (the SEM image of the YbAgCu$_4$ sample hot pressed at 650° C.), and FIG. 1F (the SEM image of the YbAgCu$_4$ sample hot pressed at 750° C.), FIGS. 1D-1F illustrate that the average grain size is about 100±about 25 nm, about 175±about 25 nm, and about 225±about 25 nm for the samples hot pressed at 550° C., 650° C., and 750° C., respectively. In some embodiments, the grain size may not be uniform and may comprise a broad size range, and in alternate embodiments, the grain size may be uniform and/or may comprise a more narrow size range.

Figure 2A:
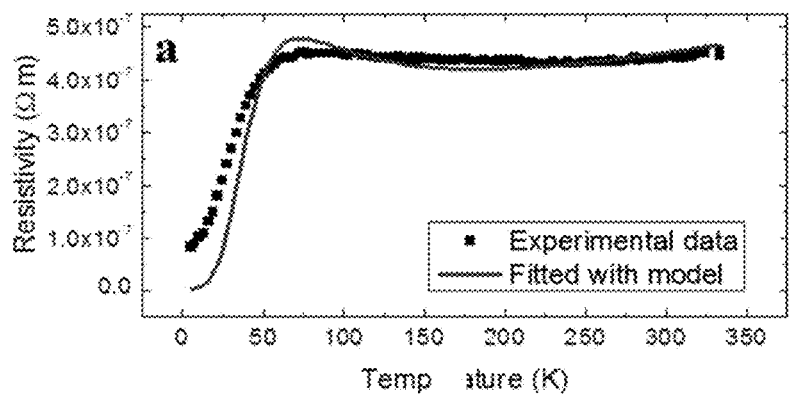
FIG. 2A is a graph of resistivity vs. temperature for $YbAgCu_4$ samples hot pressed at various temperatures according to certain embodiments of the present disclosure.
Figure 2B:
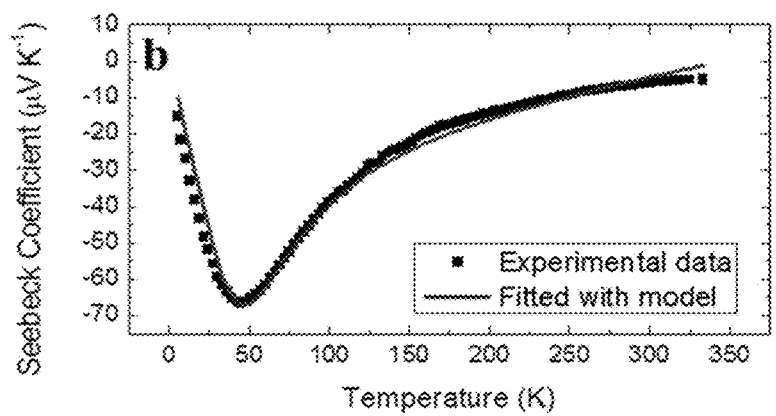
FIG. 2B is a graph of the Seebeck coefficient vs. temperature for $YbAgCu_4$ samples hot pressed at various temperatures according to embodiments of the present disclosure.

The thermoelectric properties of YbAgCu$_4$ samples fabricated according to embodiments of the present disclosure are presented in FIGS. 2A-2C and 3A 3E. Referring to FIG. 2A (the graph of resistivity vs. temperature) and FIG. 2B (the graph of the Seebeck coefficient vs. temperature), FIGS. 2A and 2B illustrate transport behavior of a YbAgCu$_4$ sample hot pressed at 650° C. The dominant contribution to electrical resistivity is due to electron-phonon interaction and scattering of electron between conduction band and Lorentzian-shaped 4f band. The contribution from electron phonon scattering is linear to temperature, and on the basis of Mott's analogy, resistivity due to scattering of electrons of the conduction band and f band is proportional to the density of state of f states at the Fermi level. The density of states of f states at the Fermi level can be written as $N_f(e_F)=W(T)/(T_o^2|(W(T))^2)$, where, $W(T)=T_f \exp(T_f/T)$ is the width of f band and $T_o(k_\beta T_o=e_F-e_f$ where $\varepsilon_F$ is Fermi energy and $\varepsilon_f$ is energy corresponding to center of gravity of 4f peak.) is the central position of 4f band from Fermi level. The term $T_f$ is a temperature dependent parameter and related to quasi-elastic line width of neutron spectra. So, the contribution to the electrical resistivity due to electron phonon scattering and the scattering of electron between conduction and f band can be written as:

$$\rho = aT + \frac{bW(T)}{(T_o^2 + (W(T))^2)}$$

Where a is the strength of electron phonon scattering, and b is the strength of hybridization between s and f bands. From FIG. 2A, it is observed that the measured resistivity matches well with the fitted data above 45 K. When the temperature decreases from 200 K to lower temperatures, Kondo scattering is more prominent and hence the electrical resistivity increases with decreasing temperature. When the temperature goes below 75 K, the dilute Kondo system starts to transform into Kondo lattice system with sharply decrease in electric resistivity. At the very low temperatures, such as those used for cryogenic applications, for non-magnetic heavy Fermions like YbAgCu$_4$, the 4f moments are completely quenched and elastic scattering of conduction electrons vanishes. Electric resistivity varies as the square of temperature due to inelastic scattering by 4f spin fluctuation.

Figure 2C:
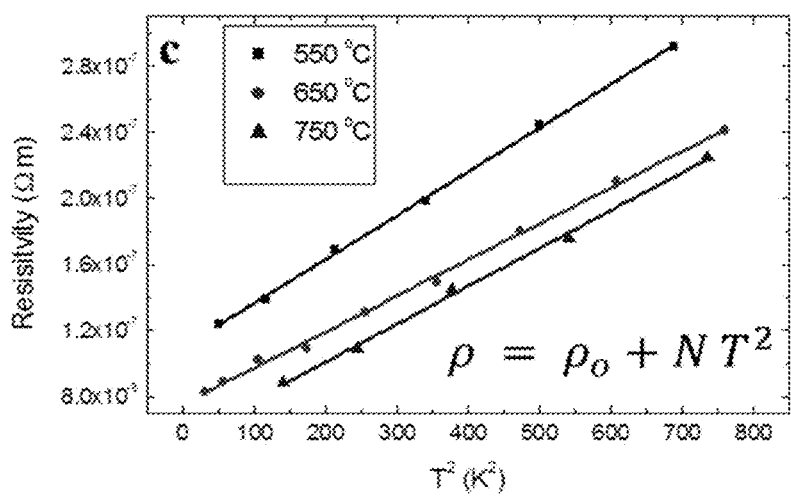
FIG. 2C is a graph illustrating the trends in resistivity vs. temperature for $YbAgCu_4$ samples hot pressed at 550° C., 650° C., and 750° C. according to certain embodiments of the present disclosure.

Turning to FIG. 2C (the graph illustrating the trends in resistivity v. temperature for YbAgCu$_4$ samples hot pressed at 550° C., 650° C., and 750° C.), FIG. 2C shows that the electrical resistivity of all samples can be fitted with Fermi liquid theory below 27 K.

Figure 3A:
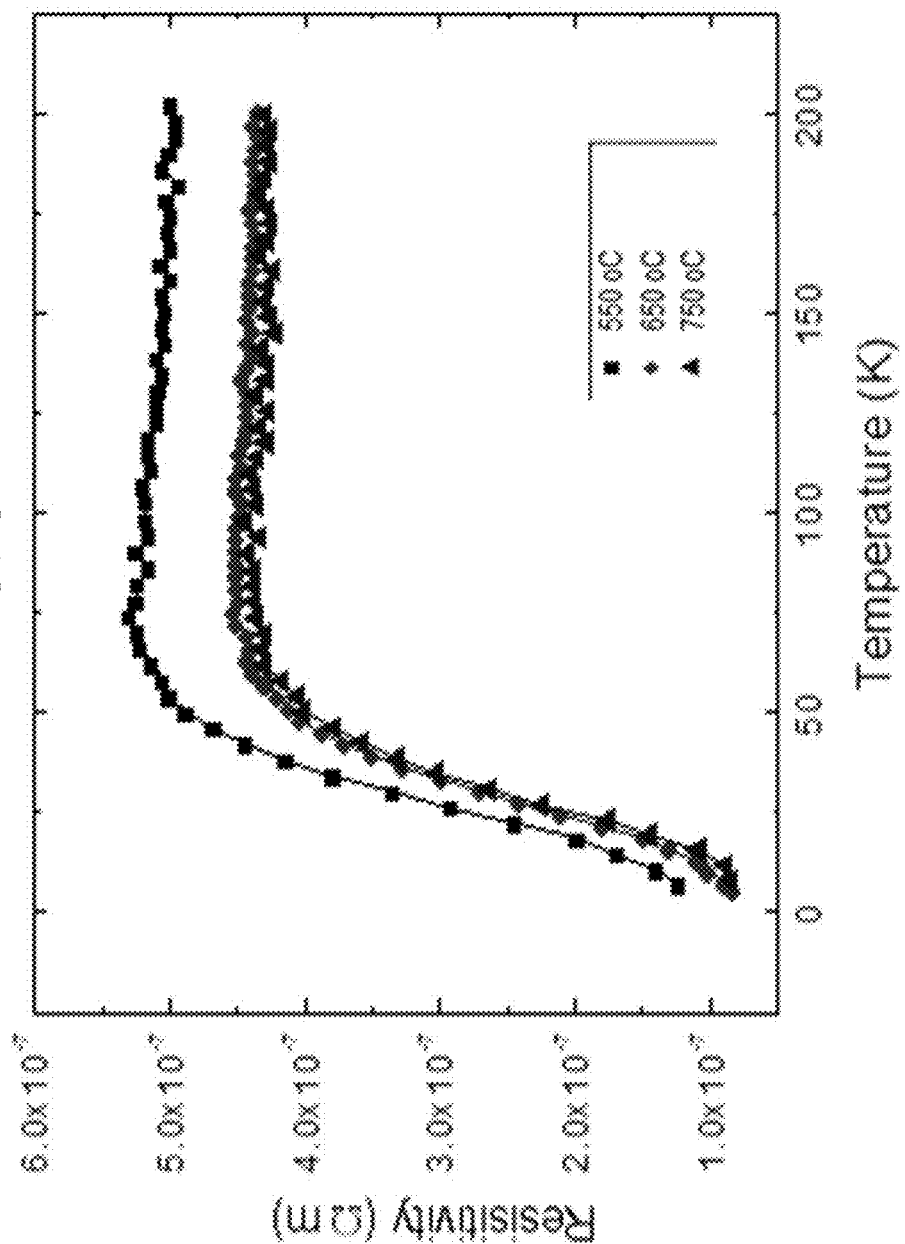
FIG. 3A illustrates the electrical resistivity after hot-pressing for samples of $YbAgCu_4$ fabricated according to certain embodiments of the present disclosure.

Turning to FIG. 3A which illustrates the electrical resistivity for samples of YbAgCu$_4$ hot pressed at different temperatures, the electrical resistivity of the sample hot pressed at 550° C. is higher compared to the other two samples (650° C., and 750° C.). This can be understood as boundary scattering of conduction electrons from grain boundary.

The Seebeck coefficient is dependent on the energy derivative of density of states at Fermi level as $$S = c_1 T + c_2 T \left[\frac{\partial \ln N_f(\varepsilon)}{\partial \varepsilon}\right]_{(\varepsilon=\varepsilon_f)}$$

Using the Lorentzian density of states of f band at Fermi level, Seebeck coefficient can be expressed as $$S = c_1 T + \frac{c_2 T T_o}{(T_o^2 + (W(T))^2)}$$

The value of $T_o$ is derived from resistivity plots and the value is 23 K. The first term gives the non-magnetic contribution to Seebeck coefficient and the second term gives the magnetic contribution to Seebeck coefficient. The same value of $T_f$ (100 K) was used and the value for $T_o$ (23 K) was extracted and fitted to the Seebeck coefficient. Raw Seebeck coefficient data match was obtained using the sample manufactured according to embodiments of the present disclosure with the phenomenological model with $c_1 = 0.175$ $\rho V\ K^{-1}$ and $c_2 = -46.713$ $\rho V\ K^{-2}$ showing that most of the contribution on Seebeck coefficient is from the magnetic scattering of conduction electron by f band. From the extracted value of $T_o$ equals to 23 K, the center of the f band was found to be about 1.9 meV below the Fermi level, giving the negative slope of density of states of f band at Fermi level which makes the negative Seebeck coefficient of $YbAgCu_4$.

Figure 3B:
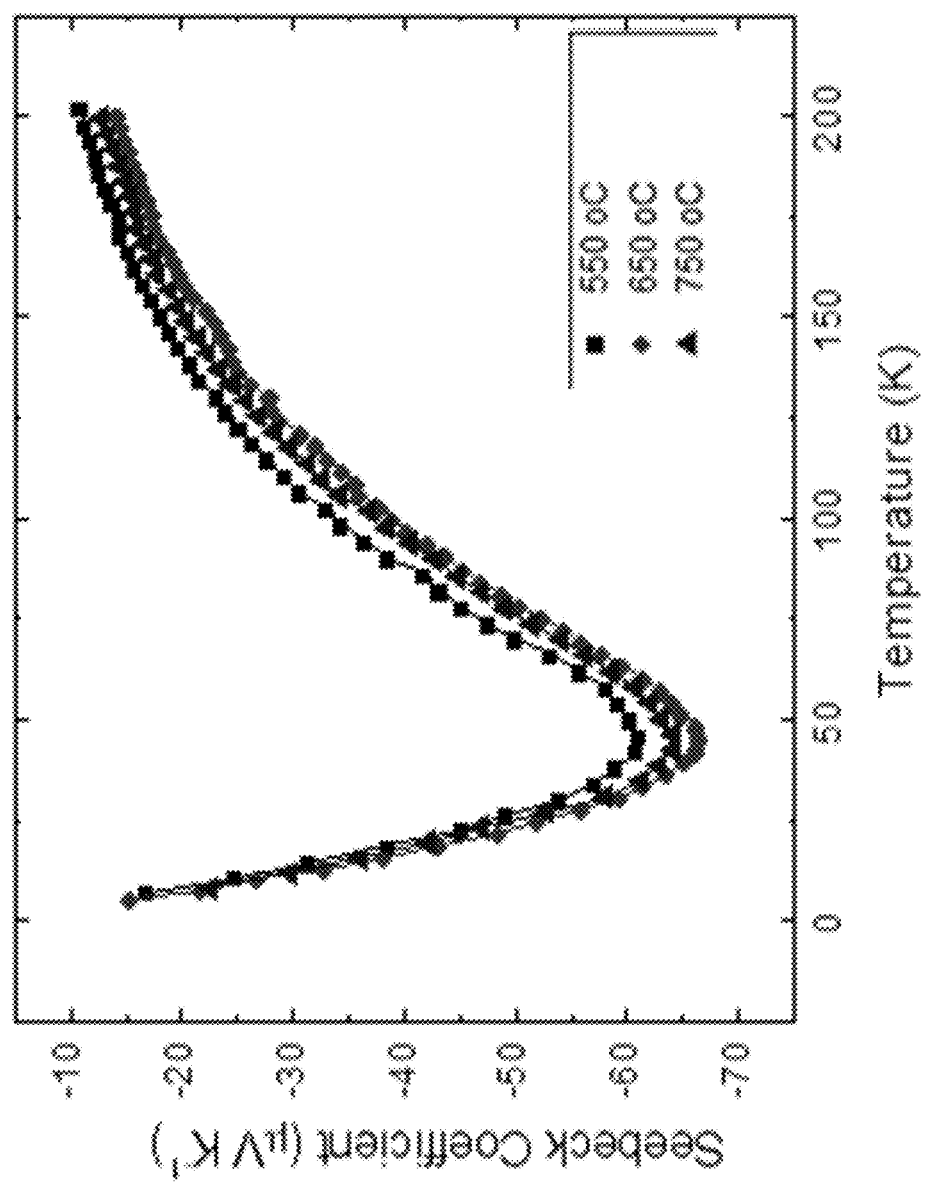
FIG. 3B illustrates the Seebeck coefficients after hot-pressing of the samples of $YbAgCu_4$ fabricated according to certain embodiments of the present disclosure.

Turning to FIG. 3B, which illustrates the Seebeck coefficients for samples of $YbAgCu_4$ hot pressed at different temperatures, the maximum Seebeck coefficient of 66 $\rho V$ $K^{-1}$ was achieved at 45 K. At very low temperature, there is a sharp drop in Seebeck coefficient due to Fermi liquid behavior.

Figure 3C:
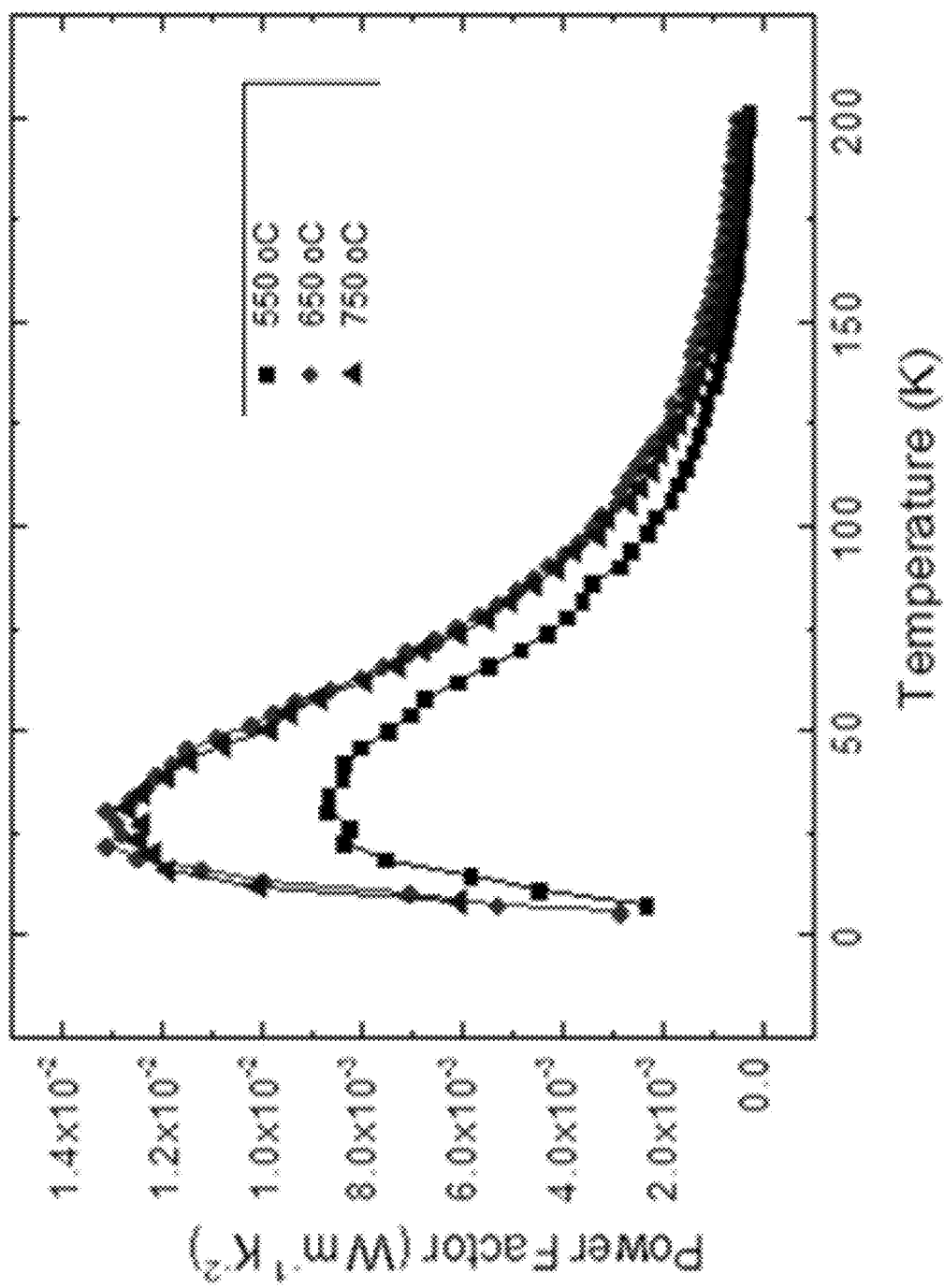
FIG. 3C shows the power factor after hot-pressing of the $YbAgCu_4$ samples fabricated according to certain embodiments of the present disclosure.

Referring to FIG. 3C, which illustrates the power factor of the $YbAgCu_4$ samples hot pressed at different temperatures, the absolute maxima of Seebeck coefficient and resistivity minimum occur at two different temperatures. In the middle temperature between the maximum Seebeck coefficient temperature and the temperature at which the maximum resistivity is observed, there is a peak power factor of 131 $\mu W$ $cm^{-1}$ $K^{-2}$ at 22 K. In the samples synthesized according to embodiments of the present disclosure shown in at least FIGS. 3A-3C, no large decrease of Seebeck coefficient with grain size occurred. The power factor may be further improved by composition optimization, elemental substitution, and doping, as discussed herein. The samples hot pressed at 650° C. and 750° C. have nearly the same power factors and resistivity that are higher than that of the sample hot pressed at 550° C. This is probably due to the higher electrical resistivity caused by the higher defect density in the samples pressed at lower temperature.

Figure 3D:
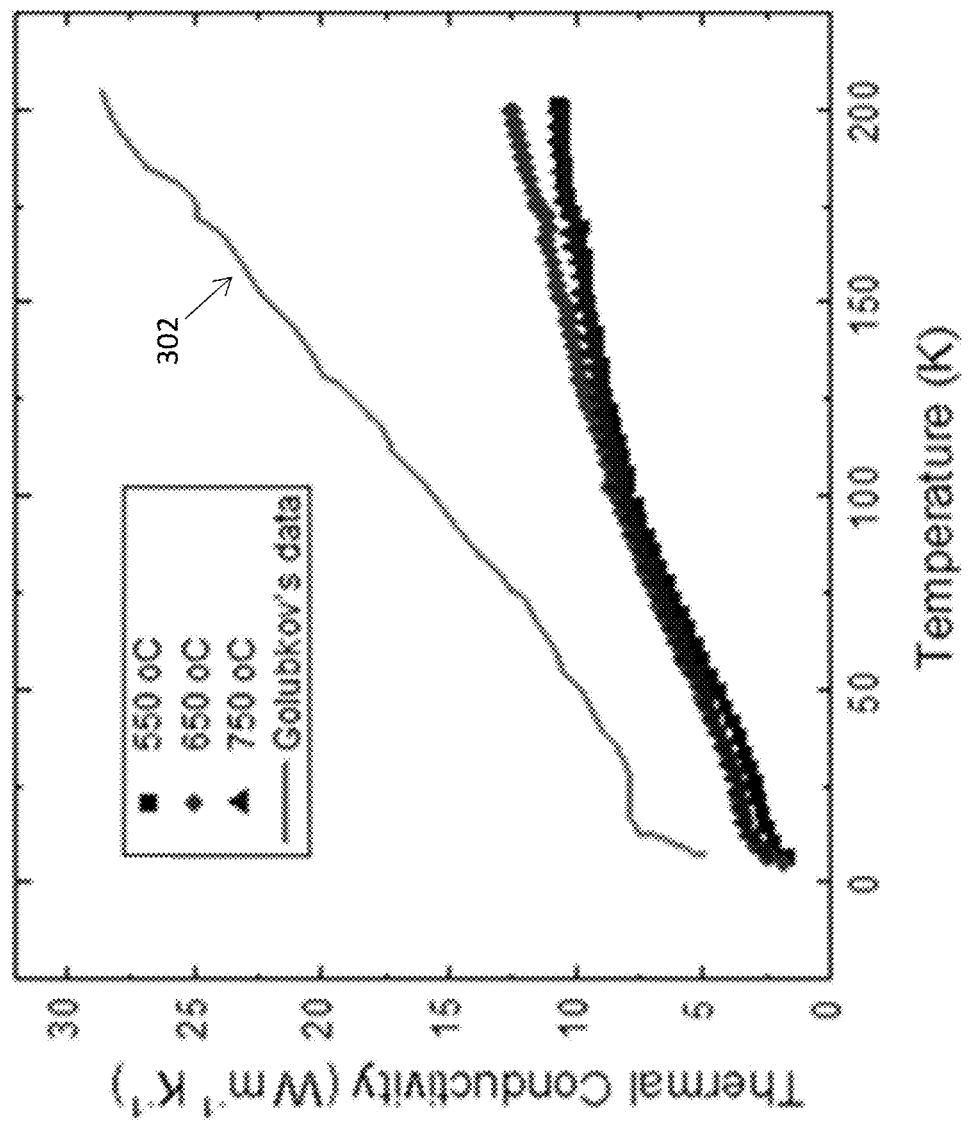
FIG. 3D shows the thermal conductivity after hot-pressing of the $YbAgCu_4$ samples fabricated according to certain embodiments of the present disclosure.

FIG. 3D shows the thermal conductivity of the $YbAgCu_4$ samples hot pressed at different temperatures. FIG. 3D illustrates the thermal conductivity for the samples hot pressed at various temperatures, as well as a line of reference data 302. The samples all show a similar trend: decrease with temperature. The thermal conductivity of the samples hot pressed at 550° C. is smaller than the other two possibly because of the smaller grain size. Since the grain size of the samples hot pressed at 650° C. and 750° C. is not much different, hence the thermal conductivity is also similar. In heavy fermions systems, the formation of gap due to hybridization of bands enhances the phonon mean free path, and thus the thermal conductivity of these materials is very high. In many heavy Fermion systems, the lattice thermal conductivity of doped samples is of the same magnitude of undoped samples, suggesting point defect scattering is not effective to decrease thermal conductivity. Short intrinsic electronic mean free path of heavy Fermions suggests that boundary scattering of phonons is one of the promising ways to decrease the thermal conductivity without significantly affecting the electrical properties of such systems. The nanostructure reduces the thermal conductivity by 50% through boundary scattering of phonons, as compared with a previously reported value 302 for polycrystalline sample (plotted in FIG. 3D for comparison).

Figure 3E:
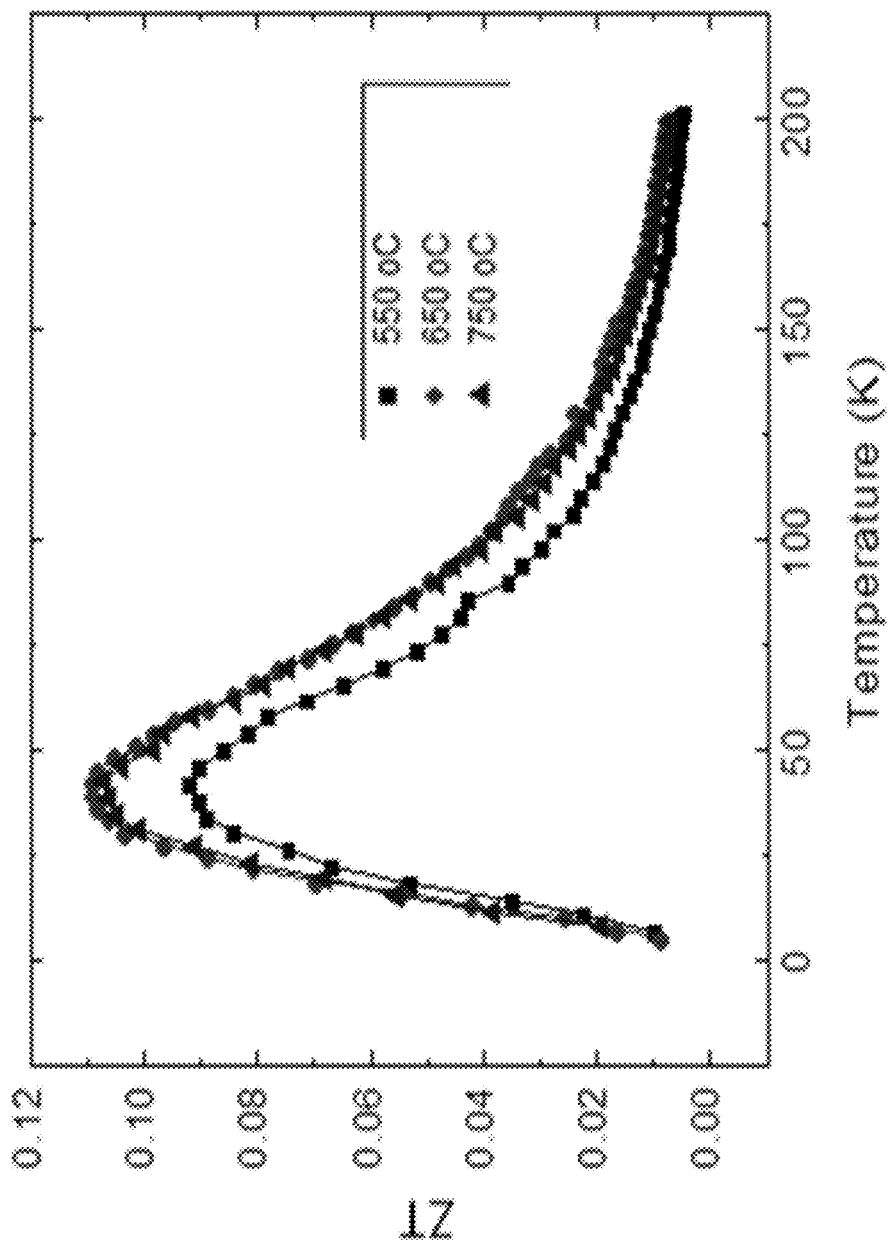
FIG. 3E shows the thermoelectric figure of merit ZT after hot-pressing of $YbAgCu_4$ samples fabricated according to certain embodiments of the present disclosure.

FIG. 3E shows the thermoelectric figure of merit ZT of $YbAgCu_4$ samples hot pressed at different temperatures. A peak ZT of 0.11 at 42 K has been achieved for samples hot pressed at 650° C. and 750° C. As illustrated herein, the $YbAgCu_4$ was fabricated using ball milling the arc-melted ingot, and then hot-pressing. In some embodiments, additional heat treatment and/or homogenization steps may be employed. The Seebeck coefficient in Yb-based heavy Fermions is due to Kondo scattering of electrons between conduction and 4f band. The electrical resistivity and Seebeck coefficient of nanostructured samples can be explained in terms of well-known phenomenological model. The good electrical conductivity of $YbAgCu_4$ leads to a high power factor of 131 $\mu W$ $cm^{-1}$ $K^{-2}$ at 22 K. The high power factor is clearly advantageous for higher ZT. A peak ZT of 0.11 has been achieved at 42 K, which is suitable for cooling applications down to this temperature.

In another embodiment, a plurality of samples were fabricated with the concentrations of Cu and Ag varying from x=0.5 to x=1.50 for $YbAg_xCu_{5-x}$. The samples were prepared as discussed herein, starting with an ingot fabricated using arc melting. The ingot may be ball milled in a high energy ball mill machine (vessel) for about 5 hours with intermediate loosening of the ball-milling vessel. In an embodiment, the nanopowder formed in response to this high energy ball milling may be hot pressed at 650° C. for 5 minutes at 100 MPa. The consolidated sample discs were characterized with XRD to see whether the pure phase had been formed or not. For all the other samples with x=0.5, 1, and 1.5, the samples were pure phase with face centered cubic (fcc) crystal structure. In some embodiments, there may be a variation of the lattice parameters with different concentrations of Cu and Ag. In some embodiments, the fabricated material may be annealed in one or more processes subsequent to hot-pressing. The annealing may not negatively impact the ZT of the thermoelectric material after hot-pressing, and in some embodiments there may be improvement.

Figure 5:
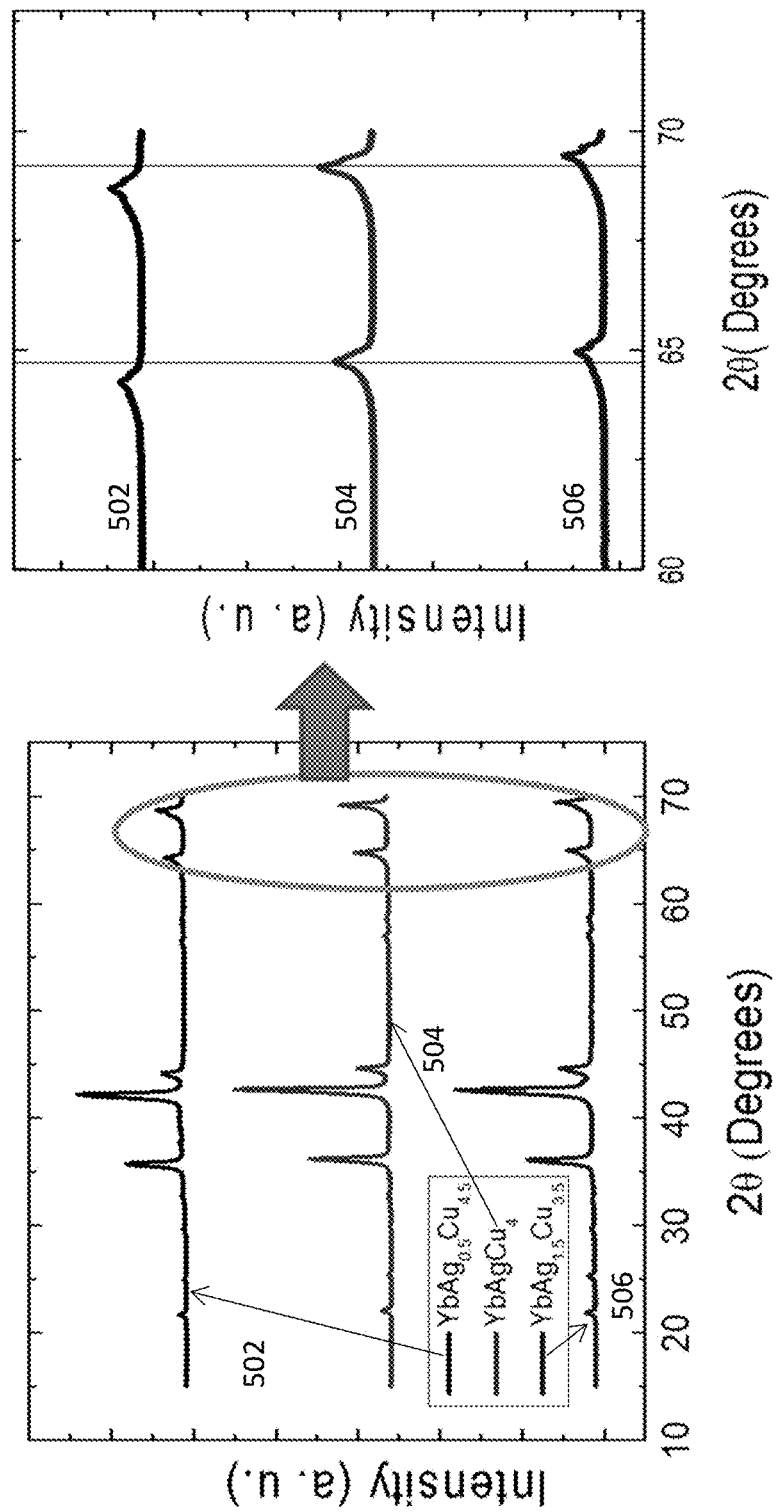
FIG. 5 is an x-ray diffraction pattern for the samples fabricated according to certain embodiments of the present disclosure.

Turning to FIG. 5, the x-ray diffraction pattern for the samples fabricated according to certain embodiments of the present disclosure, FIG. 5 illustrates the main x-ray diffraction patterns as well as an exploded view for ease of review. The samples, as indicated in FIG. 5, are $YbAg_{0.5}Cu_{4.5}$ (502), $YbAgCu_4$ (504), and $YbAg_{1.5}Cu_{3.5}$ (506), where 502 has the lowest Ag content and 506 has the highest (relative) Ag content. With variation of Cu/Ag concentration, there is change in lattice parameter which is verified with the XRD spectrum as presented in FIG. 5. As illustrated in FIG. 5, the lattice parameters increased and decreased in response to changes in the concentrations of Cu and Ag.

The results discussed herein can be understood with the behavior of Kondo system with change in lattice parameter. The change of lattice parameter causes the change in the chemical pressure of the system. The change in chemical pressure changes the Kondo temperature which shifts both Seebeck maxima position and peak ZT position.

Figure 6:
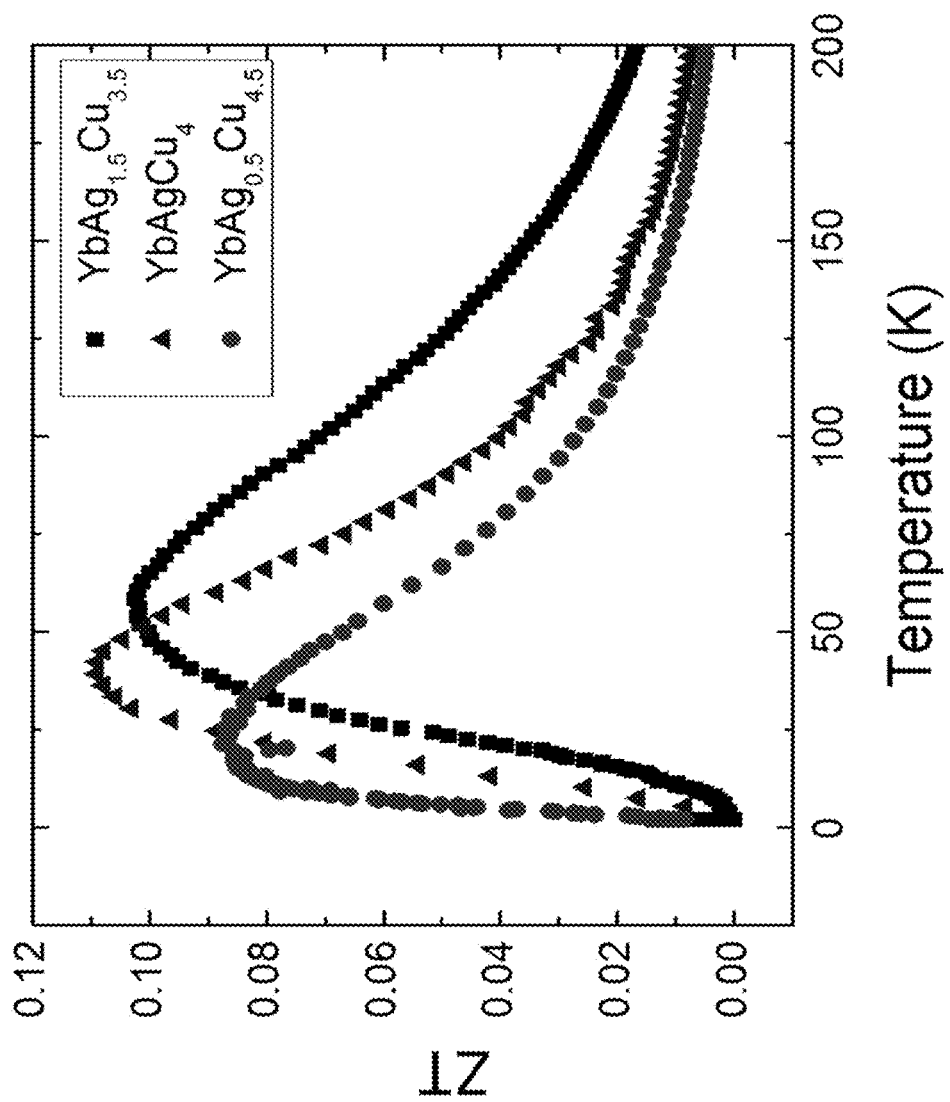
FIG. 6 is a graph of the impact of temperature on the ZT for samples of $YbAg_xCu_{5-x}$ fabricated according to embodiments of the present disclosure.

Referring now to FIG. 6, the peak ZT position shifts toward lower temperature for the samples with lower Ag concentration and shifts towards higher temperature for the sample with higher Ag concentration. The peak ZT of these samples does not exceed the value of $YbAgCu_4$. In an embodiment, a ZT obtained was 0.11 for $YbAgCu_4$ below about 50K.

By varying the concentration of Cu and Ag, the concentration of Ag may be optimized to achieve the highest peak ZT for YbAg$_x$Cu$_{5-x}$ system. In an embodiment, the desired thermoelectric properties may be optimized by a ratio of Yb:Ag:Cu of about 1:1:4. In alternate embodiments, the ratio of Yb:Ag:Cu may be about 1:0.5:4.5, or 1:1.5:3.5.

FIG. 7 is an illustration of a temperature gradient along a thermoelectric device that may comprise thermoelectric materials fabricated according to embodiments of the present disclosure. Thermoelectric devices are heat engines which work between two different temperatures. By fabricating similar materials having different peak ZT positions, the materials can be used to make the segmented legs with higher performance. The segmented leg with end having a smaller Ag concentration can be used at lower temperature side, while the sample fabricated to comprise a higher Ag concentration can be used on the higher temperature side. By this approach, the coefficient of performance of thermoelectric cooling system can be increased.

Figure 4:
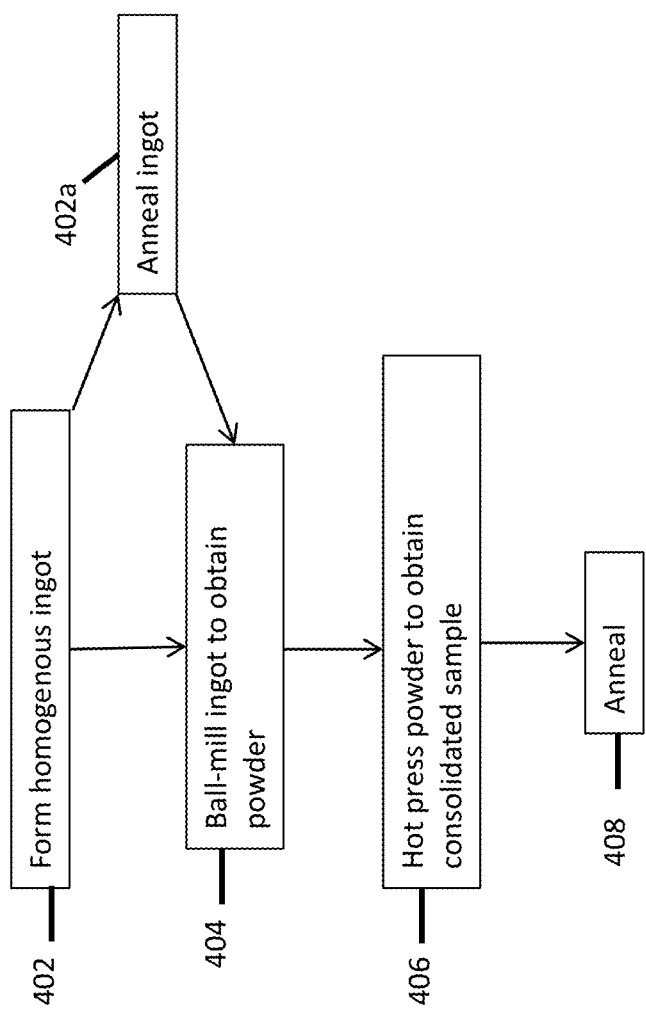
FIG. 4 is a flowchart of a method of manufacturing heavy Fermion based materials with thermoelectric characteristics at cryogenic and near-cryogenic temperatures according to embodiments of the present disclosure.

One consideration when preparing segmented legs is the contact between two different kinds of thermoelectric materials. There are many different difficulties with the contact junction of two different materials like materials interaction, bonding strength, contact resistance etc. Since YbAg$_x$Cu$_{5-x}$ for x=0.5, 1, and 1.5 contains the same elements and have same structures, the contact issues between these segments may be very limited (and the resultant compatibility enhanced) as compared to segmented legs prepared using two completely different materials Referring now to a method 400 in FIG. 4 of manufacturing heavy Fermion based materials with thermoelectric characteristics at cryogenic and near-cryogenic temperatures, at block 402, a homogeneous ingot is formed that comprises a heavy Fermion based material. In one embodiment, the homogeneous ingot comprises Yb, Cu, and Ag. The ingot may be formed through arc-melting or other methods as known in the art, and may be formed during a single melt cycle or through a plurality of melt cycles. It is appreciated that heavy Fermion materials may be volatile in some environments and that an appropriate melting process would be selected for the composition at hand. In some embodiments, at block 402a, the ingot may be annealed to obtain more desirable chemical or physical properties, which may include removing or reducing impurities in the ingot. The ingot is ball-milled at block 404, and it is appreciated that the ingot may be cut or otherwise formed into smaller sections prior to ball-milling, or that multiple ingots may be ball-milled at the same time, in the same vessel, depending upon the processing circumstances. Subsequent to ball-milling, when the appropriate phase and particle size has been achieved in the ball-milling at block 404, the powder may be hot-pressed at block 406. The phase and particle size may be confirmed using x-ray diffraction and imaging as illustrated in FIGS. 1A-1F. In some embodiments, the ratio of the components, for example, Yb:Ag, Yb:Cu, and Ag:Cu, or any of Yb, Ag, and Cu to a dopant, in the thermoelectric materials disclosed herein may range from 1:1-1:10.

In an embodiment, the three-component system may comprise a Yb:Ag:Cu formula according to YbAgCu$_4$. In alternate embodiments, the Yb:Ag:Cu composition may have some or all of its components partially replaced by other elements, for example, rare earth elements, gold (Au), zinc (Zn), cadmium (Cd), mercury (Hg), aluminum (Al), gallium (Ga), indium (In), and tellurium (Te). In one embodiment, the thermoelectric material may be according to the formula A$_X$B$_Y$C$_Z$, and in an alternative embodiment the elements A, B, and/or C may be substituted in whole or in part according to a formula A$_X$M$_Q$B$_Y$L$_P$ or according to a formula A$_X$M$_Q$B$_Y$L$_P$C$_Z$K$_R$, providing that the selected formula and processing steps result in the desired phase. In that embodiment, where X=1, Y=1, and Z=1, "A" may be replaced in part by "M," "B" may be replaced in part by "L," and "C" may be replaced in part by "K." It is understood, therefore in this embodiment, that "X"+"Q"=1, "Y"+"P"=1, and "Z"+"R"=1. In alternate embodiments that may also use the formula A$_X$M$_Q$B$_Y$L$_P$C$_Z$K$_R$, at least one of X, Y, and Z may be greater than one. In this embodiment, "A" may be replaced in part by "M," "B" may be replaced in part by "L," and "C" may be replaced in part by "K."

At block 406, the powder may be hot-pressed using one or more cycles into any shape as appropriate for the end application or for further processing. A cycle may be defined by the time and/or pressure and/or temperature at which a material is hot-pressed, and if a plurality of cycles is employed, the cycles may vary in temperature, pressure, and/or duration. The hot-pressing may occur in one cycle or in a plurality of cycles. The powder is hot-pressed at block 406 from 550° C.-850° C., and in some embodiments from 300° C.-1500° C. for varying amounts of time. In some embodiments, at block 408, the hot-pressed YbAgCu$_4$ may then be further processed, for example, by annealing. In other embodiments, the post-hot-pressing processing may include annealing and/or other heat treatment, hot-working, or cold-working process. This method 400 forms a nanostructured compound of YbAgCu$_4$ with a ZT of at least 0.11 at below about 42 K.

Exemplary embodiments are disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, R$_l$, and an upper limit, R$_u$, is disclosed, any number falling within the range is specifically disclosed. In particular, the following numbers within the range are specifically disclosed: R=R$_l$+k*(R$_u$−R$_l$), wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of broader terms such as "comprises," "includes," and "having" should be understood to provide support for narrower terms such as "consisting of," "consisting essentially of," and "comprised substantially of." Accordingly, the scope of protection is not limited by the description set out above but is defined by the claims that follow, that scope including all equivalents of the subject matter of the claims. Each and every claim is incorporated into the specification as further disclosure, and the claims are exemplary embodiment(s) of the present invention.

While exemplary embodiments of the invention have been shown and described, modifications thereof can be made by one skilled in the art without departing from the scope or teachings herein. The embodiments described herein are exemplary only and are not limiting. Many variations and modifications of the compositions, systems, apparatus, and processes described herein are possible and are within the scope of the invention. Accordingly, the scope of protection is not limited to the exemplary embodiments described herein, but is only limited by the claims that follow, the scope of which shall include all equivalents of the subject matter of the claims. Unless expressly stated otherwise, the steps in a method claim may be performed in any order and with any suitable combination of materials and processing conditions.

What is claimed:

1. A method comprising:
manufacturing a thermoelectric material at a first silver (Ag) concentration and manufacturing a thermoelectric material at a second Ag concentration, wherein the first Ag concentration is lower than the second Ag concentration, wherein manufacturing the thermoelectric material at the first Ag concentration and manufacturing the thermoelectric material at the second Ag concentration comprise:
forming an ingot comprising ytterbium (Yb), copper (Cu), and silver (Ag);
forming a nanopowder from the ingot; and
hot-pressing the nanopowder,
wherein the thermoelectric material at the first Ag concentration and the thermoelectric material at the second Ag concentration have a formula:
$YbAg_xCu_{5-x}$, wherein the ratio of Cu to Ag is about (4+x):(1−x) to (4−x)·1+x), wherein x is greater for the thermoelectric material at the second Ag concentration than the thermoelectric material at the first Ag concentration, and wherein the thermoelectric material at the first Ag concentration and the thermoelectric material at the second Ag concentration comprise a ZT of greater than 0.10 at below about 45 K; and
preparing a segmented leg of a thermoelectric device having a lower temperature side and a higher temperature side, wherein an end of the segmented leg on the lower temperature side comprises the thermoelectric material at the first Ag concentration and an end of the segmented leg on the higher temperature side comprises the thermoelectric material at the second Ag concentration.

2. The method of claim 1, wherein forming the ingot comprising the ytterbium (Yb), copper (Cu), and silver (Ag) comprises arc melting silver (Ag) and copper (Cu) to create one or more homogeneous Ag—Cu alloy pieces and subsequently melting ytterbium (Yb) with one or more of the one or more homogeneous Ag—Cu alloy pieces to form the ingot.

3. The method of claim 2, wherein forming the nanopowder comprises ball-milling the ingot.

4. The method of claim 1, wherein a ratio of the Yb to the Ag in the thermoelectric material at the first Ag concentration or the thermoelectric material at the second Ag concentration is about 1:1.

5. The method of claim 1, wherein the ingot is homogeneous.

6. The method of claim 1, wherein the thermoelectric material at the first Ag concentration and the thermoelectric material at the second Ag concentration comprise a nanostructured material including a plurality of grains from about 1 nm to about 1000 nm in diameter subsequent to hot-pressing.

7. The method of claim 1, further comprising hot-pressing the nanopowder at a temperature between about 500° C. to about 1000° C. and a pressure of about 100 MPa.

8. The method of claim 1, further comprising, subsequent to the hot-pressing, performing at least one of hot work, cold work, or heat treatment on the hot-pressed powder.

9. The method of claim 1, wherein the thermoelectric material at the first Ag concentration and the thermoelectric material at the second Ag concentration further comprise a resistivity below $5.0 \times 10^{-7}$ Ωm below about 50K.

10. The method of claim 1, wherein the thermoelectric material at the first Ag concentration and the thermoelectric material at the second Ag concentration further comprise a peak power factor of over 8.0 $Wm^{-1} K^{-2}$ at a temperature in a range of from about 12.5K to about 75K.

11. The method of claim 1, wherein the thermoelectric material at the first Ag concentration and the thermoelectric material at the second Ag concentration further comprise a nanostructured material consisting of a plurality of grains having boundaries.

12. The method of claim 1, wherein the thermoelectric material at the first Ag concentration and the thermoelectric material at the second Ag concentration comprise a single phase.

13. A method comprising:
manufacturing a thermoelectric material at a first silver (Ag) concentration and manufacturing a thermoelectric material at a second Ag concentration, wherein the first Ag concentration is lower than the second Ag concentration, wherein manufacturing the thermoelectric material at the first Ag concentration and manufacturing the thermoelectric material at the second Ag concentration comprise:
forming an ingot comprising ytterbium (Yb), copper (Cu), and silver (Ag);
ball milling the ingot to form a nanopowder; and
hot-pressing the nanopowder,
wherein the thermoelectric material at the first Ag concentration and the thermoelectric material at the second Ag concentration have a formula:
$YbAg_xCu_{5-x}$, wherein x is greater for the thermoelectric material at the second Ag concentration than the thermoelectric material at the first Ag concentration, and wherein the thermoelectric material at the first Ag concentration and the thermoelectric material at the second Ag concentration comprise a ZT of greater than 0.10 at below about 45 K; and
preparing a segmented leg of a thermoelectric device having a lower temperature side and a higher temperature side, wherein an end of the segmented leg on the lower temperature side comprises the thermoelectric material at the first Ag concentration and an end of the segmented leg on the higher temperature side comprises the thermoelectric material at the second Ag concentration.

14. The method of claim 13, wherein the cryogenic thermoelectric material at the first Ag concentration has x=0.5 or 1.0, and wherein the thermoelectric material at the second Ag concentration has x=1.0 or 1.5, x is greater for the thermoelectric material at the second Ag concentration than the thermoelectric material at the first Ag concentration.

15. A method comprising:
manufacturing a thermoelectric material at a first silver (Ag) concentration and manufacturing a thermoelectric material at a second Ag concentration, wherein the first Ag concentration is lower than the second Ag concentration, wherein manufacturing the thermoelectric material at the first Ag concentration and manufacturing the thermoelectric material at the second Ag concentration comprise:
forming a homogeneous ingot comprising ytterbium (Yb), copper (Cu), and silver (Ag);
forming a nanopowder by ball milling the homogeneous ingot; and
hot-pressing the nanopowder,
wherein the cryogenic thermoelectric material at the first Ag concentration and the thermoelectric material at the second Ag concentration have a formula:
$YbAg_xCu_{5-x}$, wherein the ratio of Cu to Ag is about (4+x):(1−x) to (4−x):1+x), and wherein x is greater for the thermoelectric material at the second Ag concentration than the thermoelectric material at the first Ag concentration, and wherein the thermoelectric material at the first Ag concentration and the thermoelectric material at the second Ag concentration comprise a thermal conductivity from about 5 $Wm^{-1} K^{-1}$ to about 10 $Wm^{-1} K^{-1}$ from about 40K to about 120K and a ZT above 0.1 at a temperature below about 75K; and
preparing a segmented leg of a thermoelectric device having a lower temperature side and a higher temperature side, wherein an end of the segmented leg on the lower temperature side comprises the thermoelectric material at the first Ag concentration and an end of the segmented leg on the higher temperature side comprises the thermoelectric material at the second Ag concentration.

16. The method of claim 15, further comprising hot-pressing the nanopowder at a temperature between about 500° C. to about 1000° C. and a pressure of about 100 MPa.

17. The method of claim 15, wherein the thermoelectric material at the first Ag concentration and the thermoelectric material at the second Ag concentration further comprise a minimum Seebeck coefficient below −60 $\mu VK^{-1}$ at a temperature in a range of from about 25K to about 75K.

18. The method of claim 15, wherein the cryogenic thermoelectric material at the first Ag concentration has x=0.5 or 1.0, and wherein the thermoelectric material at the second Ag concentration has x=1.0 or 1.5, provided x is greater for the thermoelectric material at the second Ag concentration than the thermoelectric material at the first Ag concentration.

* * * * *